(12) United States Patent
Lee et al.

(10) Patent No.: US 8,775,992 B2
(45) Date of Patent: Jul. 8, 2014

(54) DESIGNING PHOTONIC SWITCHING SYSTEMS UTILIZING EQUALIZED DRIVERS

(75) Inventors: Benjamin G. Lee, New York, NY (US); Jonathan E. Proesel, Yorktown Heights, NY (US); Alexander V. Rylyakov, Mount Kisco, NY (US); Clint L. Schow, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/604,337

(22) Filed: Sep. 5, 2012

(65) Prior Publication Data

US 2014/0068534 A1 Mar. 6, 2014

(51) Int. Cl.
*G06F 17/50* (2006.01)
(52) U.S. Cl.
USPC .......................................... 716/111
(58) Field of Classification Search
USPC .................................. 716/100, 111
See application file for complete search history.

(56) References Cited

U.S. PATENT DOCUMENTS

| 2003/0025962 | A1 | 2/2003 | Nishimura |
| 2003/0048506 | A1* | 3/2003 | Handelman ............... 359/128 |
| 2005/0105906 | A1* | 5/2005 | Barbosa et al. ............ 398/54 |
| 2006/0140645 | A1 | 6/2006 | Shastri et al. |
| 2006/0263088 | A1* | 11/2006 | Handelman ............... 398/51 |
| 2007/0098408 | A1* | 5/2007 | Handelman ............... 398/152 |
| 2009/0129775 | A1* | 5/2009 | Handelman ............... 398/47 |
| 2009/0237127 | A1 | 9/2009 | Noguchi et al. |
| 2010/0123945 | A1 | 5/2010 | Kai |

FOREIGN PATENT DOCUMENTS

| CN | 101170001 A | 4/2008 |
| CN | 102064806 A | 5/2011 |

OTHER PUBLICATIONS

Kai, et al., "A compact and lossless 8×8 SOA gate switch subsystem for WDM optical packet interconnections," IEEE ECOC, Sep. 21-25, 2008, 2 pages, vol. 3-117.
Lee,, et al., "Demonstration of a Digital CMOS Driver Codesigned and Integrated With a Broadband Silicon Photonic Switch," IEEE Journal of Lightwave Technology, Apr. 15, 2011, pp. 1136-1142, vol. 29, No. 8.
Campenhout, et al., "Low-power, 2X2 silicon electro-optic switch with 110-nm bandwidth for broadband reconfigurable optical networks," Optical Society of America, Dec. 21, 2009, 10 pages, Optics Express 24020, vol. 17, No. 26.

(Continued)

*Primary Examiner* — Suchin Parihar
(74) *Attorney, Agent, or Firm* — Yee & Associates, P.C.; Anne Dougherty

(57) ABSTRACT

Designing a photonics switching system is provided. A photonic switch diode is designed to attain each performance metric in a plurality of performance metrics associated with a photonic switching system based on a weighted value corresponding to each of the plurality of performance metrics. A switch driver circuit is selected from a plurality of switch driver circuits for the photonic switching system. It is determined whether each performance metric associated with the photonic switching system meets or exceeds a threshold value corresponding to each of the plurality of performance metrics based on the photonic switch diode designed and the switch driver circuit selected. In response to determining that each performance metric associated with the photonic switching system meets or exceeds the threshold value corresponding to each of the performance metrics, the photonic switching system is designed using the photonic switch diode designed and the switch driver circuit selected.

19 Claims, 8 Drawing Sheets

(56) References Cited

OTHER PUBLICATIONS

Zheng, et al., "Optical proximity communication using reflective mirrors," Optical Society of America, Sep. 15, 2008, 7 pages, Optics Express 15052, vol. 16, No. 19.

Lee, et al., "Designing Photonic Switching Systems Utilizing Equalized Drivers," U.S. Appl. No. 13/755,004, filed Sep. 14, 2012, 37 pages.

Rylyakov et al., "Transmitter Predistortion for Simultaneous Improvements in Bit Rate, Sensitivity, Jitter, and Power Efficiency in 20 Gb/s CMOS-Driven VCSEL Links," Journal of Lightwave Technology, vol. 30, No. 4, Feb. 2012, pp. 399-405.

Xu et al., "12.5 Gbit/s carrier-injection-based silicon micro-ring silicon modulators," Optics Express, vol. 15, No. 2, Jan. 2007, pp. 430-436.

PCT Search Report regarding application PCT/US2013/057945, dated Feb. 13, 2014, 12 pages.

Rylyakov et al., "Silicon Photonic Switches Hybrid-Integrated With CMOS Drivers," IEEE Journal of Solid-State Circuits, vol. 47, No. 1, Jan. 2012, pp. 345-354.

\* cited by examiner

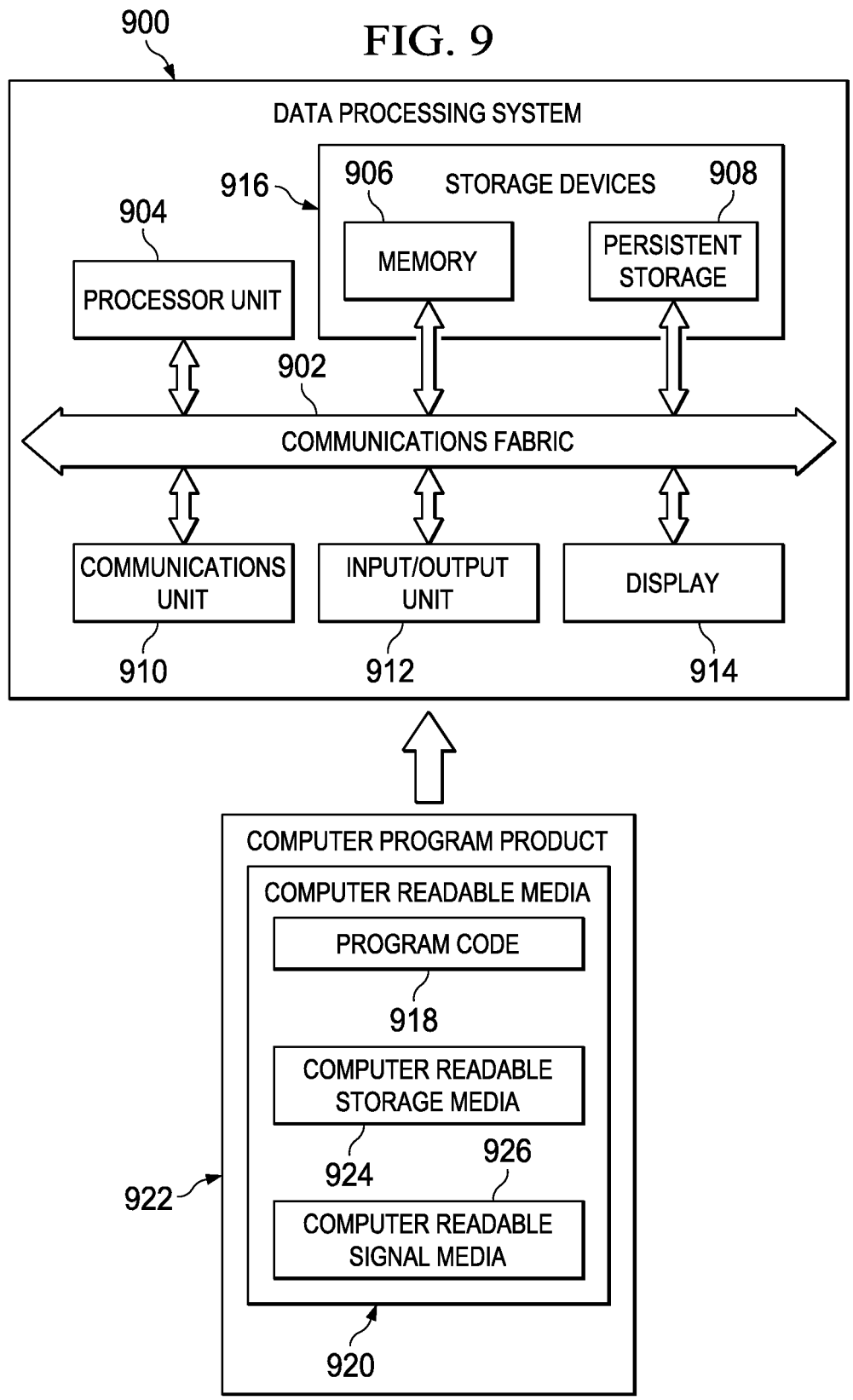

US 8,775,992 B2

DESIGNING PHOTONIC SWITCHING SYSTEMS UTILIZING EQUALIZED DRIVERS

This invention was made with Government support under Contract No.: W911NF-11-2-0059 (awarded by Defense Advanced Research Projects Agency (DARPA)). The Government has certain rights in this invention.

BACKGROUND

1. Field

The disclosure relates generally to an improved silicon photonic chip and more specifically to designing a photonic switching system that utilizes an equalized driver to increase performance of photonic switch diodes located on the silicon photonic chip.

2. Description of the Related Art

Silicon (Si) photonics is a technology that is under worldwide research and development due to its promise of delivering high performance optical components built in low-cost silicon chip technologies. Silicon photonics is the study and application of photonic systems that use silicon as an optical medium. The silicon is patterned with sub-micrometer precision into silicon photonic components. The silicon typically lies on top of a layer of silica in what is known as silicon-on-insulator (SOI).

Photonic switches have been considered as a replacement to electrical switches due to their very large per-port bandwidth enabled by wavelength-division multiplexing, and due to the energy savings provided by the mitigation of optical detection and re-transmission before and after the electrical switch. Photonic switches, which often leverage phase alteration within forward or reverse biased diodes to achieve path selectivity, have demonstrated broad spectral operation with low crosstalk. Designing a photonic switch can be a complex task, requiring tradeoffs of various performance metrics for an optimized design. Notably, speed of the photonic switch is often traded for or against other performance metrics in the design of the photonic switch.

SUMMARY

According to one embodiment of the present invention, a method for designing a photonic switching system is provided. A data processing system designs a photonic switch diode to attain each performance metric in a plurality of performance metrics associated with a photonic switching system based on a weighted value corresponding to each of the plurality of performance metrics. In addition, the data processing system selects an electronic switch driver circuit design from a plurality of electronic switch driver circuit designs for the photonic switching system. The data processing system determines whether each performance metric in the plurality of performance metrics associated with the photonic switching system meets or exceeds a threshold value corresponding to each of the plurality of performance metrics based on the photonic switch diode designed by the data processing system and the electronic switch driver circuit design selected by the data processing system. Then, in response to the data processing system determining that each performance metric in the plurality of performance metrics associated with the photonic switching system meets or exceeds the threshold value corresponding to each of the performance metrics, the data processing system designs the photonic switching system using the photonic switch diode designed by the data processing system and the electronic switch driver circuit design selected by the data processing system that met or exceeded each threshold value corresponding to each of the plurality of performance metrics associated with the photonic switching system based on the weighted value of each performance metric.

BRIEF DESCRIPTION OF THE SEVERAL VIEWS OF THE DRAWINGS

FIG. 9 is a diagram of a data processing system in accordance with an illustrative embodiment.

DETAILED DESCRIPTION

With reference now to the figures, and in particular, with reference to FIGS. 1-6, diagrams of apparatuses are provided in which illustrative embodiments may be implemented. It should be appreciated that FIGS. 1-6 are only meant as examples and are not intended to assert or imply any limitation with regard to the apparatuses in which different embodiments may be implemented. Many modifications to the depicted apparatuses may be made.

Figure 1:
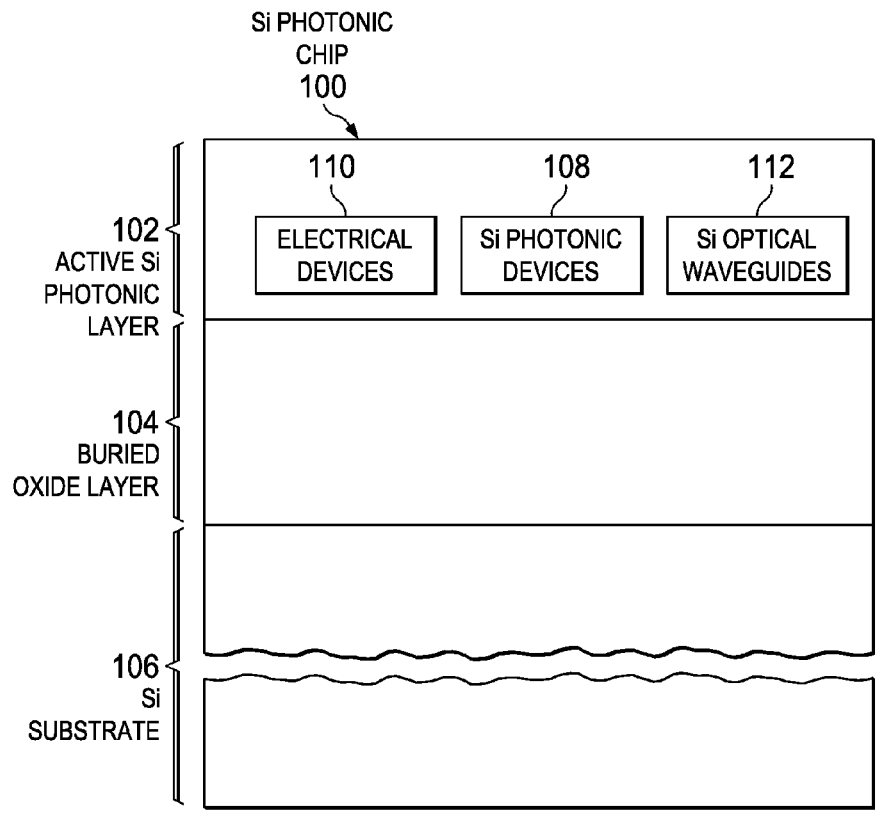
FIG. 1 is a diagram of a cross-section view of a silicon photonic chip in accordance with an illustrative embodiment.

FIG. 1 depicts a cross-section view of a silicon photonic chip in accordance with an illustrative embodiment. Silicon photonic chip 100 is an example of a semiconductor chip that may be used in a data processing system, such as a computer. In addition, silicon photonic chip 100 is capable of routing optical signals (i.e., pulses of light), which are used to communicate data. In other words, silicon photonic chip 100 is an optical switching device or an array of such devices. Silicon photonic chip 100 includes active silicon photonic layer 102, buried oxide layer 104, and silicon substrate 106.

Active silicon photonic layer 102 is located on a front side of silicon photonic chip 100. Active silicon photonic layer 102 transports the optical signals or pulses of light and is typically 150-300 nanometers in thickness. Active silicon photonic layer 102 includes silicon photonic devices 108, which are essentially transparent to the optical signals at a wavelength of approximately 1.1 to beyond 2.0 micrometers. In addition, active silicon photonic layer 102 also includes electronic devices 110. However, it should be noted that active silicon photonic layer 102 may include both silicon photonic devices 108 and electronic devices 110 or may only include silicon photonic devices 108.

The photonic devices (i.e., silicon optical structures) are fabricated within active silicon photonic layer 102. A photonic device is any optical structure fabricated in active silicon photonic layer 102 that guides, generates, manipulates, or detects the pulses of light. Examples of photonic devices are lasers, optical modulators, photodetectors, and optical switch diodes, along with silicon optical waveguides 112, which are used to transport the optical signals to and from the photonic devices. Examples of electronic devices that may be included in active silicon photonic layer 102 are transistors, capacitors, resistors, and inductors. A standard process for fabricating these photonic and electronic devices is a complementary metal oxide-semiconductor (CMOS) process.

Buried oxide layer 104 of silicon photonic chip 100 is buried between active silicon photonic layer 102 and silicon substrate 106. Buried oxide layer 104 may, for example, be comprised of silicon dioxide ($SiO_2$) material. Typically, buried oxide layer 104 is greater than or equal to one to two micrometers in thickness.

Silicon substrate 106 is on a backside of silicon photonic chip 100. Silicon substrate 106 is a bulk silicon layer that provides support for silicon photonic chip 100. Typically, silicon substrate 106 is greater than or equal to 300 micrometers.

In the course of developing illustrative embodiments, it was discovered that through a process of passivating the sidewalls of the silicon optical waveguides with a thin layer of silicon nitride ($Si_3N_4$) the lifetime of an electronic carrier within a photonic switch diode that enables photonic switching within optical waveguides formed in the active silicon photonic layer may be altered by two orders of magnitude. This thin layer of silicon nitride has a negligible effect on the optical mode within the silicon optical waveguide, but has a substantial effect on surface recombination, thereby influencing the electronic carrier lifetime for a photonic switch diode constructed across the silicon optical waveguide. Photonic switch diodes with an increased carrier lifetime demonstrate extremely low steady-state power consumption, but suffer from decreased reconfiguration speeds. Conversely, photonic switch diodes with a decreased carrier lifetime enable increased reconfiguration speeds, but require increased amounts of power to hold the photonic switch diode in an ON-state due to the increased recombination current in the photonic switch diode during steady-state operation. Therefore, within photonic switch diodes a trade-off exists between reconfiguration speed and power consumption.

In addition, photonic switch diodes may suffer from decreased reconfiguration speeds for other reasons. For example, when using silicon optical waveguides that have a cross sectional dimension greater than one micrometer ($\mu m$), the reconfiguration speed of the photonic switch diode is decreased. Typically, the cross sectional dimension of a silicon optical waveguide is less than 1 micrometer. This increased mode size of the silicon optical waveguide provides increased alignment tolerances, more efficient optical coupling between the silicon photonic devices and a standard single-mode optical fiber, and decreased light propagation and device insertion losses. However, the increased cross sectional dimension of the silicon optical waveguide requires an increased length of the photonic switch diode, which leads to decreased reconfiguration speed of the photonic switch diode or slower operation of the photonic switch diode.

Another example of influencing the reconfiguration speed of the photonic switch diode is choosing between reverse-biased diodes and forward-biased diodes. Forward-biased diodes have a decreased footprint or size, but also have a significantly slower reconfiguration speed as compared to reverse-biased diodes. Therefore, photonic switch diode designers often sacrifice the low drive voltage associated with the slower reconfiguration speed and smaller footprint achievable with a forward-biased diode design for the reconfiguration speed afforded by a reverse-biased diode design.

Thus in each of the examples above, a tradeoff exists between speed of the photonic switch diode and other performance metrics, such as power consumption of the photonic switch diode, size or footprint of the photonic switch diode, alignment tolerance of the photonic switch diode with an optical cable, and cost of the photonic switch diode. However, illustrative embodiments use a system-wide optimization approach that designs the photonic switch diodes in conjunction with selecting a custom electronic switch driver circuit design from a plurality of electronic switch driver circuit designs that increases performance of the designed photonic switch diodes (e.g., increases the speed of the photonic switch diodes). The plurality of electronic switch driver circuit designs may be, for example, a current mode logic design, an inverter logic design, and an inverter logic design coupled with an inductively peaked inverter logic design. Each of these electronic switch driver circuit designs may employ, for example, feed-forward equalization techniques and be implemented in a complementary metal oxide-semiconductor driver.

Illustrative embodiments by using this system-wide optimization approach increase the speed of the photonic switch diode by customizing the switch drivers. Consequently, the design of the photonic switch diode can sacrifice speed performance of the photonic switch diode for gains in optical coupling efficiency, footprint, power consumption, and cost with no loss in the speed of the overall photonic switching system, which includes the photonic switch diode and the electronic switch driver circuit. As a result, illustrative embodiments break the inherent speed tradeoffs in photonic switch design by selecting the appropriate switch driver architecture or design that yields an increased system-wide response.

In addition, even though a photonic modulator and a photonic switch diode may in some cases share similar structures and topologies, the prioritized performance metrics of a photonic modulator and a photonic switch diode rarely overlap. For example, pre-emphasizing a photonic modulator is primarily done to increase the bandwidth of the photonic modulator and is done at the expense of other performance metrics, such as power consumption. Whereas for a photonic switch diode, illustrative embodiments leverage pre-emphasis as a means of maintaining the reconfiguration speed of the photonic switch diode while making gains in other critical photonic switching system performance metrics, such as power consumption, footprint, alignment tolerance, and cost. Thus, it should be noted that illustrative embodiments are not just simply making the photonic switch diode as fast as possible. This distinction is important because it leads to different options for the switch driver circuit design. For example, illustrative embodiments may use a complementary metal oxide-semiconductor driver based on inverter logic or may use a complementary metal oxide-semiconductor driver based on inverter logic and inductively peaked inverter logic to drive the photonic switch diode. Alternatively, illustrative embodiments may use a complementary metal oxide-semiconductor driver based on current-mode logic to drive the photonic switch diode. Each of these driver designs may employ feed-forward equalization.

Figure 2:
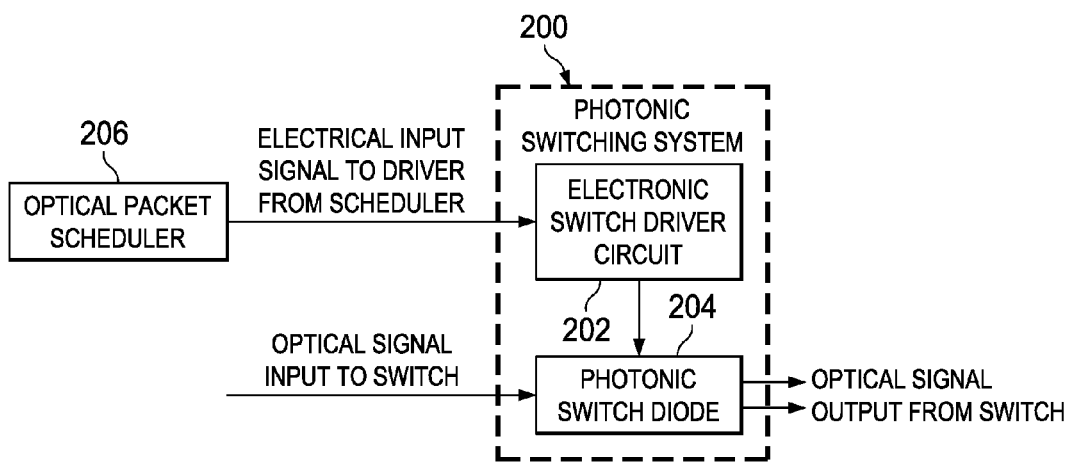
FIG. 2 is a diagram of a photonic switching system in accordance with an illustrative embodiment.

With reference now to FIG. 2, a diagram of a photonic switching system is depicted in accordance with an illustrative embodiment. Photonic switching system 200 is a system of components designed to increase the speed of optical signal transmission without increasing other system performance metrics, such as power consumption, size, and cost. Photonic switching system 200 includes electronic switch driver circuit 202 and photonic switch diode 204.

Electronic switch driver circuit 202 is, for example, a complementary metal oxide-semiconductor driver that drives photonic switch diode 204 by outputting a drive waveform from electronic switch driver circuit 202 to photonic switch diode 204 based on an electrical input signal received by electronic switch driver circuit 202 from optical packet scheduler 206. Optical packet scheduler 206 schedules optical packets for transmission by photonic switch diode 204. Electronic switch driver circuit 202 generates the drive waveform from the electrical input signal received from optical packet scheduler 206 by using one of inverter logic, inverter logic and inductively peaked inverter logic in combination, or current mode logic.

Photonic switch diode 204 is a photonic device located in an active silicon photonic layer of a silicon photonic chip, such as one of silicon photonic devices 108 located in active silicon photonic layer 102 of silicon photonic chip 100 in FIG. 1. In this example, photonic switch diode 204 is a routing switch for routing optical signals or packets to an appropriate output port in a plurality of output ports. Also, in this illustrated example, photonic switch diode is shown to include one input port and two output ports. However, it should be noted that photonic switch diode 204 may include any number of input ports and any number of output ports and that the number of input ports and the number of outputs does not have to be the same, but may be the same. Further, electronic switch driver circuit 202 and photonic switch diode 204 are located on separate chips. However, in an alternative embodiment, electronic switch driver circuit 202 and photonic switch diode 204 may be located on the same silicon photonic chip, such as electronic devices 110 and silicon photonic devices 108 located on silicon photonic chip 100 in FIG. 1.

Figure 3:
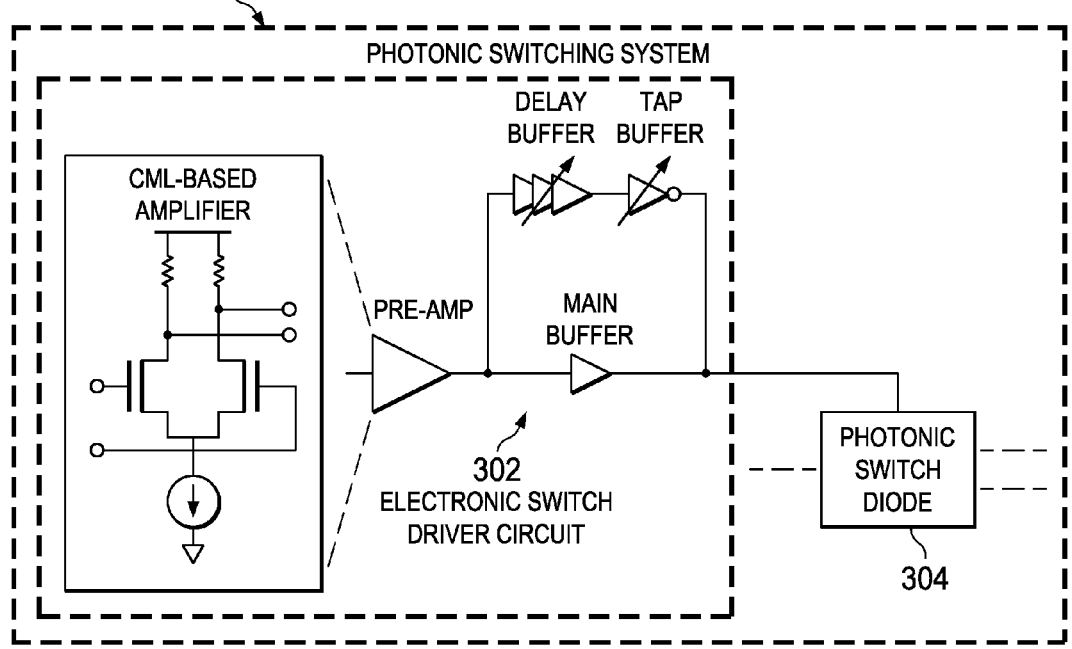
FIG. 3 is a pictorial illustration of a photonic switching system that includes a current mode logic-based driver circuit and a photonic switch diode in accordance with an illustrative embodiment.
Figure 3:
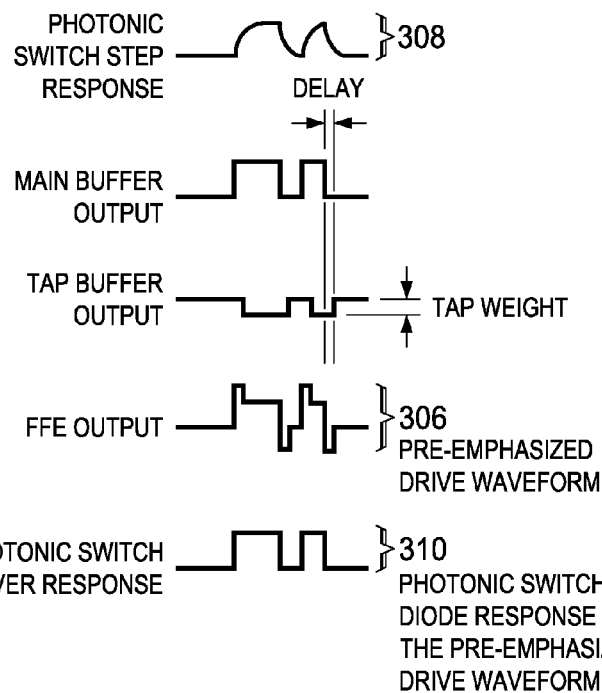

With reference now to FIG. 3, a pictorial illustration of a photonic switching system that includes a current mode logic-based driver circuit and a photonic switch diode is depicted in accordance with an illustrative embodiment. Photonic switching system 300 may be, for example, photonic switching system 200 in FIG. 2. Photonic switching system 300 includes electronic switch driver circuit 302 and photonic switch diode 304, such as electronic switch driver circuit 202 and photonic switch diode 204 in FIG. 2.

In this illustrated example, electronic switch driver circuit 302 is a complementary metal oxide-semiconductor driver based on current mode logic that employs feed-forward equalization to drive photonic switch diode 304. Electronic switch driver circuit 302 pre-amplifies an electrical signal received from an optical packet scheduler, such as optical packet scheduler 206 in FIG. 2, and applies equalization to the electronic signal to generate pre-emphasized drive waveform 306, which is used to drive photonic switch diode 304. It should be noted that in this illustrated example, solid lines in the circuit schematic denote electrical connections, whereas the dashed lines denote optical or photonic connections.

Photonic switch diode 304, by itself, has a slower step response as shown by photonic switch step response 308, which leads to decreased reconfiguration speeds of photonic switch diode 304 causing increased network inefficiencies. However, the response of photonic switching system 300, which is photonic switch diode 304 being driven by the current mode logic-based feed-forward equalization driver (i.e., electronic switch driver circuit 302), shows faster transitions between states of photonic switch diode 304 in photonic switch diode response to the pre-emphasized drive waveform 310. Further, although photonic switch diode 304 is illustrated with one input port and two output ports, illustrative embodiments may utilize any integral combination of input ports and output ports in photonic switch diode 304.

Furthermore, it should be noted that even though this illustrated example demonstrates the efficacy of this approach, current mode logic circuit designs are not the preferred illustrative embodiment for implementing the electronic switch driver circuits. Because photonic switch diode 304 may frequently be held in a steady-state for long periods of time, the always-on current mode logic tail currents result in increased average power consumption as compared to inverter logic-based electronic complementary metal oxide-semiconductor designs. The smaller footprint of the inverter logic-based designs complement the density afforded with photonic switch diodes. In addition, inverter logic-based designs are capable of providing ultra-low steady-state supply currents, which are beneficial to photonic switching systems that may be held in the ON-state or the OFF-state for long periods of time. Co-designing switch drivers using inverter logic in electronic complementary metal oxide-semiconductor designs requires a system view, which considers each of the prioritized performance metrics of the photonic switching system that is often headed up by low steady-state power dissipation. Unfortunately, a simple approach to an inverter-based feed-forward equalization driver that mimics the current mode logic circuit techniques results in larger supply currents in the steady-state as shown in the illustration of FIG. 4.

Figure 4:
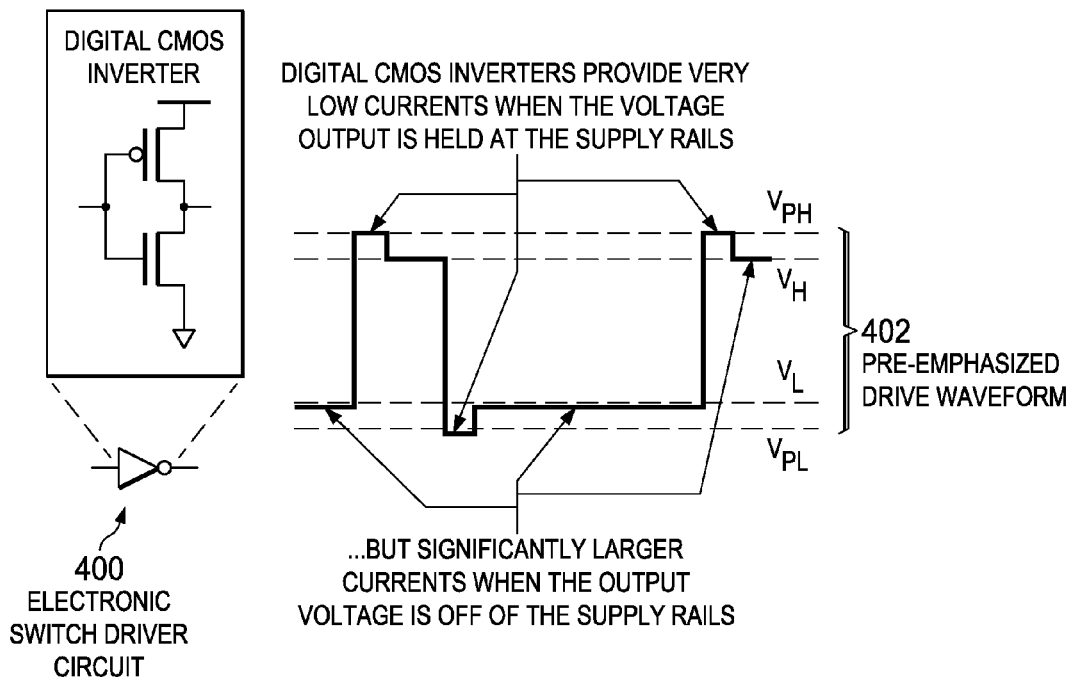
FIG. 4 is a pictorial illustration of an inverter logic-based driver circuit and a drive waveform that exits the driver circuit in accordance with an illustrative embodiment.

With reference now to FIG. 4, a pictorial illustration of an inverter logic-based driver circuit and a drive waveform that exits the driver circuit is depicted in accordance with an illustrative embodiment. Electronic switch driver circuit 400 may be, for example, electronic switch driver circuit 202 in FIG. 2. In this illustrated example, electronic switch driver circuit 400 is a complementary metal oxide-semiconductor driver based on inverter logic that employs feed-forward equalization to drive a photonic switch diode, such as photonic switch diode 204 in FIG. 2. Electronic switch driver circuit 400 pre-amplifies an electrical signal received from an optical packet scheduler, such as optical packet scheduler 206 in FIG. 2, and applies equalization to the electronic signal to generate pre-emphasized drive waveform 402, which is used to drive the photonic switch diode. As shown in this illustrated example, electronic switch driver circuit 400 provides lower currents when the output voltage is held at the supply rails, but provides higher currents when the output voltage is off of the supply rails. A challenge using this approach of a complementary metal oxide-semiconductor driver design based on inverter logic that employs feed-forward equalization is the condition that the circuit's output voltage must remain on one of the supply rails as much as possible in order to maintain lower supply currents and thus lower power consumption.

Figure 5:
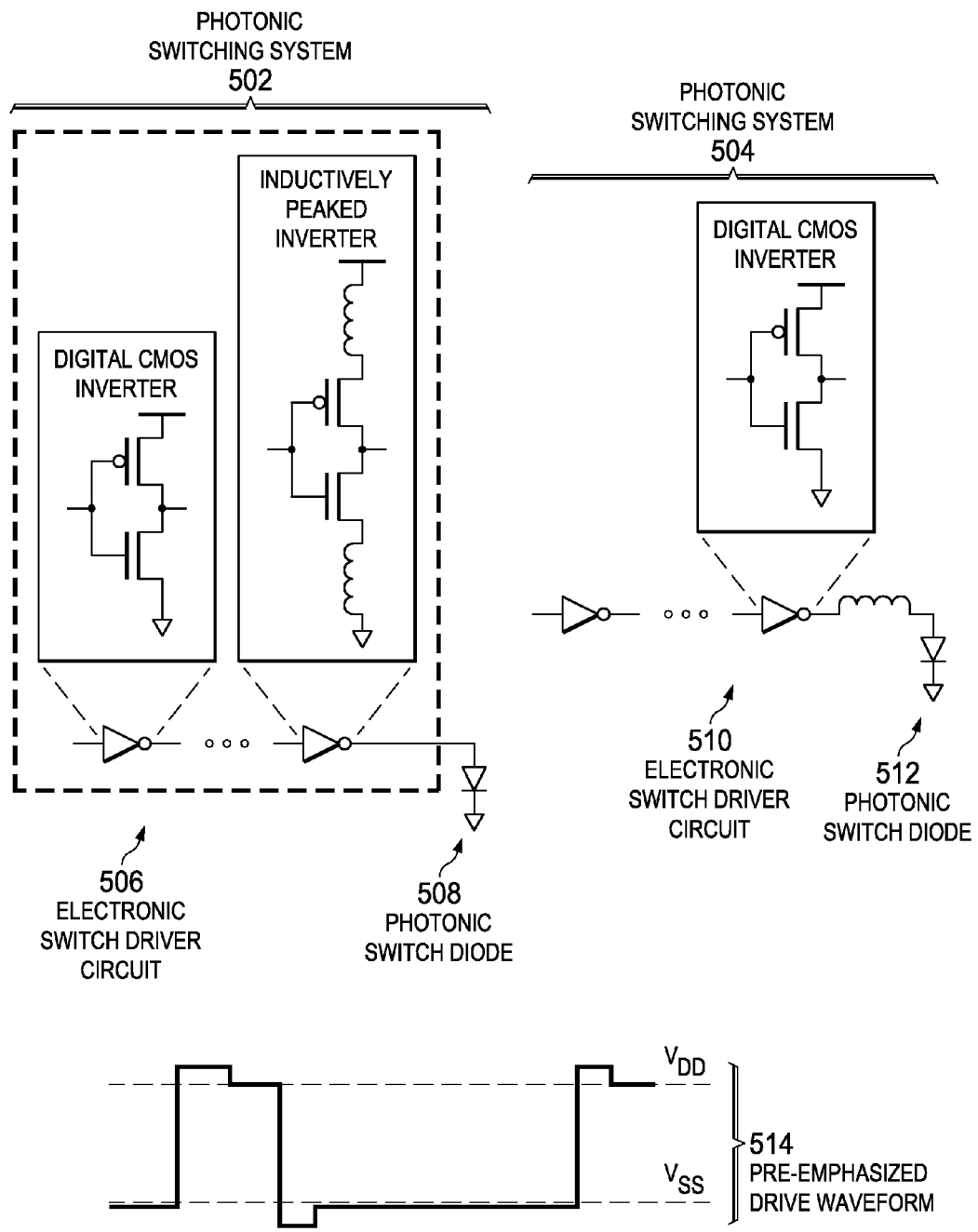
FIG. 5 is a pictorial illustration of two different photonic switching systems in accordance with an illustrative embodiment.

With reference now to FIG. 5, a pictorial illustration of two different photonic switching systems is depicted in accordance with an illustrative embodiment. Photonic switching system 502 and photonic switching system 504 represent preferred illustrative embodiments. Photonic switching system 502 and photonic switching system 504 may be, for example, photonic switching system 200 in FIG. 2.

Photonic switching system 502 includes electronic switch driver circuit 506 and photonic switch diode 508, such as electronic switch driver circuit 202 and photonic switch diode 204 in FIG. 2. In this illustrated example, electronic switch driver circuit 506 is a complementary metal oxide-semiconductor driver based on inverter logic and inductively peaked inverter logic that employs feed-forward equalization to drive photonic switch diode 508. Electronic switch driver circuit 506 pre-amplifies an electrical signal received from an optical packet scheduler, such as optical packet scheduler 206 in FIG. 2, and applies equalization to the electronic signal to generate pre-emphasized drive waveform 514, which is used to drive photonic switch diode 508.

Electronic switch driver circuit 506, which is a complementary metal oxide-semiconductor driver design based on inverter logic and inductively peaked inverter logic, leverages inductive peaking in electronic switch driver circuit 506 to enable overshoot, undershoot, or both on drive waveform 514 exiting electronic switch driver circuit 506. Pre-emphasized drive waveform 514, which resembles pre-emphasized drive waveform 306 in FIG. 3, is able to increase the speed performance of photonic switching system 502. In particular, the ability to add overshoot to the rising edge of the drive waveform, undershoot to the falling edge of the drive waveform, or both, enables the selective speed-up of only the OFF-state to ON-state transition of the photonic switch diode, the selective speed-up of only the ON-state to OFF-state transition of the photonic switch diode, or both, respectively. This is a specific instance of the more general description in paragraph [0040]. It should be noted that in the steady-state, pre-emphasized drive waveform 514 returns to the supply rails where power consumption is minimal.

Photonic switching system 504 includes electronic switch driver circuit 510 and photonic switch diode 512, such as electronic switch driver circuit 202 and photonic switch diode 204 in FIG. 2. In this illustrated example, electronic switch driver circuit 510 is a complementary metal oxide-semiconductor driver based on inverter logic with inductive loading that enables overshoot, undershoot, or both on the waveform used to drive photonic switch diode 512. Electronic switch driver circuit 510 pre-amplifies an electrical signal received from the optical packet scheduler and applies equalization to the electronic signal to generate pre-emphasized drive waveform 514, which is used to drive photonic switch diode 512.

Figure 6:
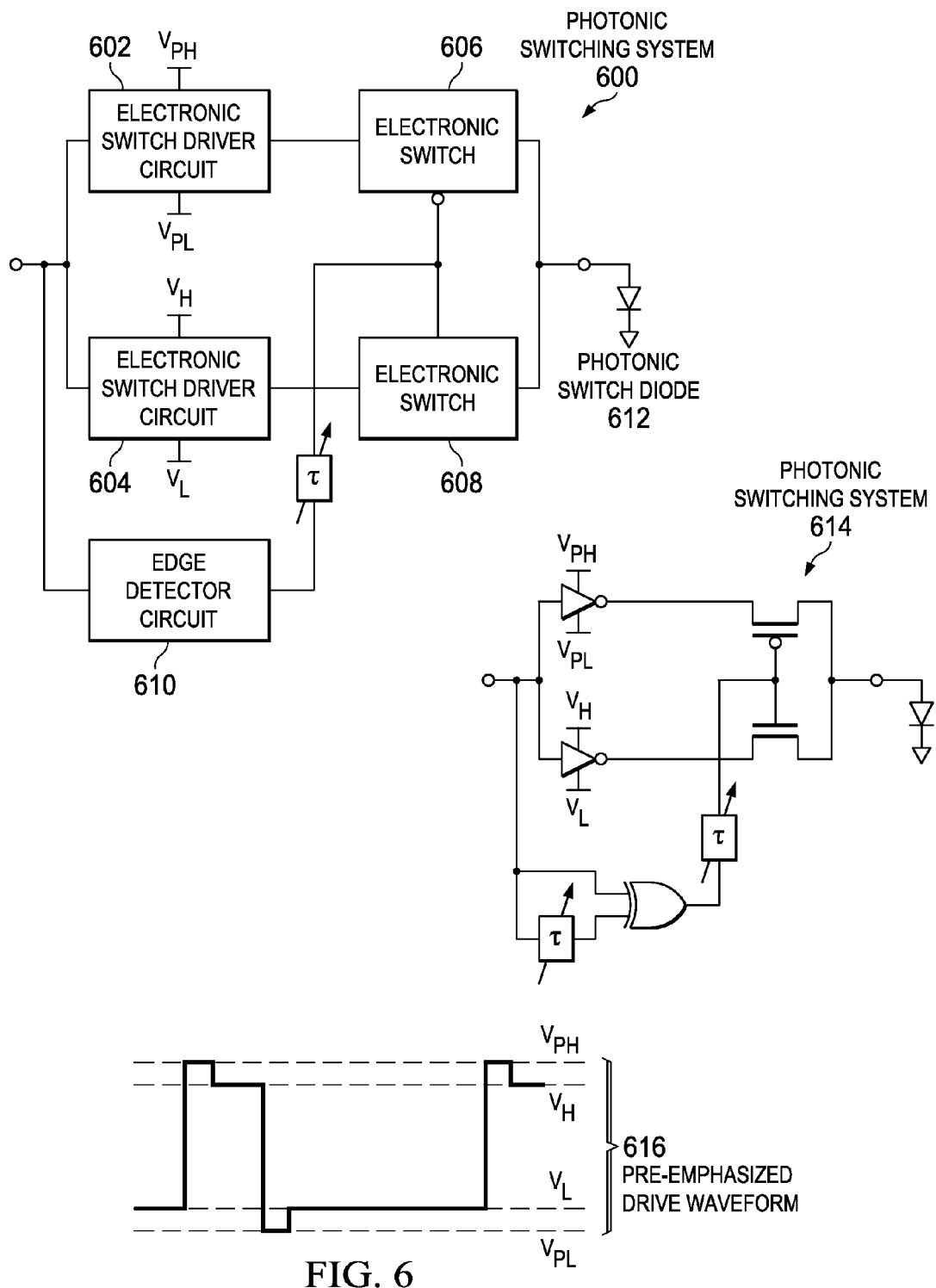
FIG. 6 is a pictorial illustration of a photonic switching system that includes two electronic switch driver circuits in accordance with an illustrative embodiment.

With reference now to FIG. 6, a pictorial illustration of a photonic switching system that includes two electronic switch driver circuits is depicted in accordance with an illustrative embodiment. Photonic switching system 600 illustrates a general implementation and photonic switching system 614 illustrates a specific implementation of a dual-power supply photonic switching system that switches between the outputs of two electronic switch driver circuits in order to generate a drive waveform of a feed-forward equalization circuit, such as pre-emphasized drive waveform 616. Photonic switching system 600 and photonic switching system 614 both include two copies of an electronic complementary metal oxide-semiconductor driver based on inverter logic with each driver circuit powered by separate and distinct supply voltages.

Photonic switching system 600 includes electronic switch driver circuit 602, electronic switch driver circuit 604, electronic switch 606, electronic switch 608, edge detector circuit 610, and photonic switch diode 612, which is driven from produced pre-emphasized drive waveform 616. Photonic switching system 600 uses edge detector circuit 610 and two electronic switches 606 and 608 to switch between drive waveform outputs of electronic switch driver circuit 602 and electronic switch driver circuit 604 at different times. For example, edge detector circuit 610 may output a short electrical pulse that switches the output voltage from a driver circuit using a smaller supply voltage to a driver circuit using a larger supply voltage at each state change of photonic switch diode 612. The state of photonic switch diode 612 may be changed, for example, between transmission of each optical packet encoded with data.

In some cases the photonic switch diode may exhibit a slower reconfiguration speed on only one of the two state changes (i.e., rising edge or falling edge), while the other state change may exhibit a faster reconfiguration speed. In such a case, the driver circuit can be optimized through co-design with the photonic switch diode to advance the speed of the photonic switching system in only one direction (i.e., on the rising edge or the falling edge). This type of unidirectional optimization may be beneficial in decreasing cost, power consumption, and footprint.

Figure 7:
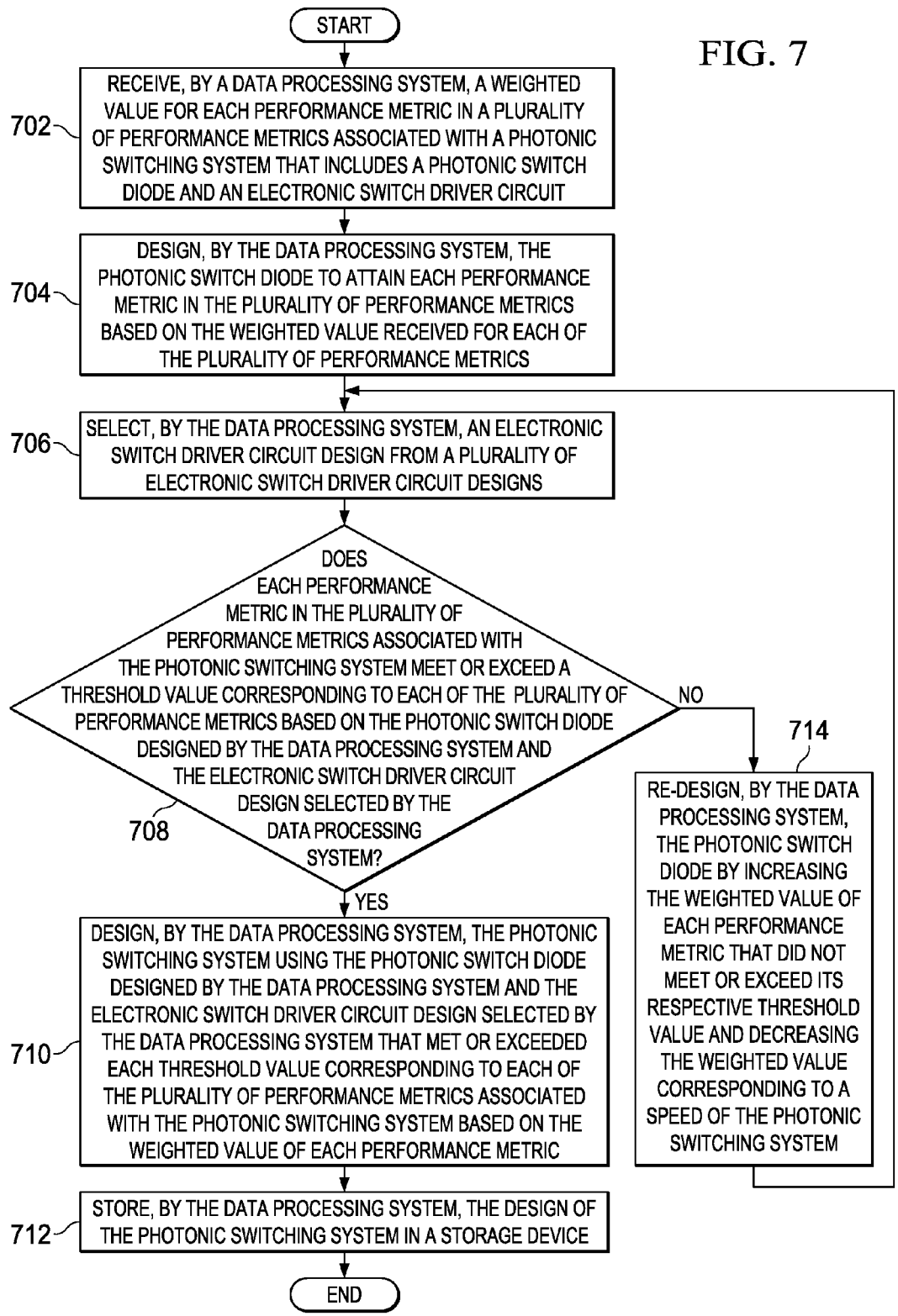
FIG. 7 is a flowchart illustrating a process for designing a photonic switching system in accordance with an illustrative embodiment.

With reference now to FIG. 7, a flowchart illustrating a process for designing a photonic switching system is shown in accordance with an illustrative embodiment. The process shown in FIG. 7 may be implemented in a data processing system, such as data processing system 900 in FIG. 9.

The process begins when the data processing system receives a weighted value for each performance metric in a plurality of performance metrics associated with a photonic switching system that includes a photonic switch diode and an electronic switch driver circuit (step 702). The photonic switching system may be, for example, photonic switching system 200 in FIG. 2 that includes electronic switch driver circuit 202 and photonic switch diode 204. The weighted values for each of the plurality of performance metrics may be received by the data processing system via user inputs or may be received from a software application executing on the data processing system. The plurality of performance metrics associated with the photonic switching system may be, for example, speed of the photonic switching system, size or footprint of the photonic switching system, power consumption of the switching system, alignment tolerance of the photonic switching system with an optical cable, and cost of the photonic switching system. A weighted value is a value assigned to each of the plurality of performance metrics that indicates a level of importance of each of the plurality of performance metrics in designing the photonic switching system. It should be noted that illustrative embodiments use speed of the photonic switching system as the primary performance metric in the plurality of performance metrics. Also, it should be noted that illustrative embodiments may utilize more performance metrics other than what is listed above.

After receiving a weighted value for each performance metric in step 702, the data processing system designs the photonic switch diode to attain each performance metric in the plurality of performance metrics based on the weighted value received for each of the plurality of performance metrics (step 704). In addition, the data processing system selects an electronic switch driver circuit design from a plurality of electronic switch driver circuit designs (step 706). The plurality of electronic switch driver circuit designs that the data processing system selects from may be, for example, a complementary metal oxide-semiconductor driver design based on inverter logic, a complementary metal oxide-semiconductor driver design based on inverter logic coupled with inductively peaked inverter logic, and a complementary metal oxide-semiconductor driver design based on current mode logic.

Subsequently, the data processing system makes a determination as to whether each performance metric in the plurality of performance metrics associated with the photonic switching system meets or exceeds a threshold value corresponding to each of the plurality of performance metrics based on the photonic switch diode designed by the data processing system in step 704 and the electronic switch driver circuit design selected by the data processing system in step 706 (step 708). The data processing system may determine that each performance metric in the plurality of performance metrics meets or exceeds the threshold value corresponding to each of the performance metrics by using, for example, a simulation program. Alternatively, the data processing system may determine that each performance metric in the plurality of performance metrics meets or exceeds the threshold value corresponding to each of the performance metrics by analyzing, for example, test data.

If the data processing system determines that each performance metric in the plurality of performance metrics associated with the photonic switching system does meet or exceed the threshold value corresponding to each of the plurality of performance metrics based on the photonic switch diode designed by the data processing system and the electronic switch driver circuit design selected by the data processing system, yes output of step 708, then the data processing system designs the photonic switching system using the photonic switch diode designed by the data processing system and the electronic switch driver circuit design selected by the data processing system that met or exceeded each threshold value corresponding to each of the plurality of performance metrics associated with the photonic switching system based on the weighted value of each performance metric (step 710). After designing the photonic switching system in step 710, the data processing system stores the design of the photonic switching system in a storage device (step 712). The process terminates thereafter.

Returning again to step 708, if the data processing system determines that each performance metric in the plurality of performance metrics associated with the photonic switching system does not meet or exceed the threshold value corresponding to each of the plurality of performance metrics based on the photonic switch diode designed by the data processing system and the electronic switch driver circuit design selected by the data processing system, no output of step 708, then the data processing system re-designs the photonic switch diode by increasing the weighted value of each performance metric that did not meet or exceed its respective threshold value and decreasing the weighted value corresponding to a speed of the photonic switching system (step 714). Thereafter, the process returns to step 706.

Figure 8:
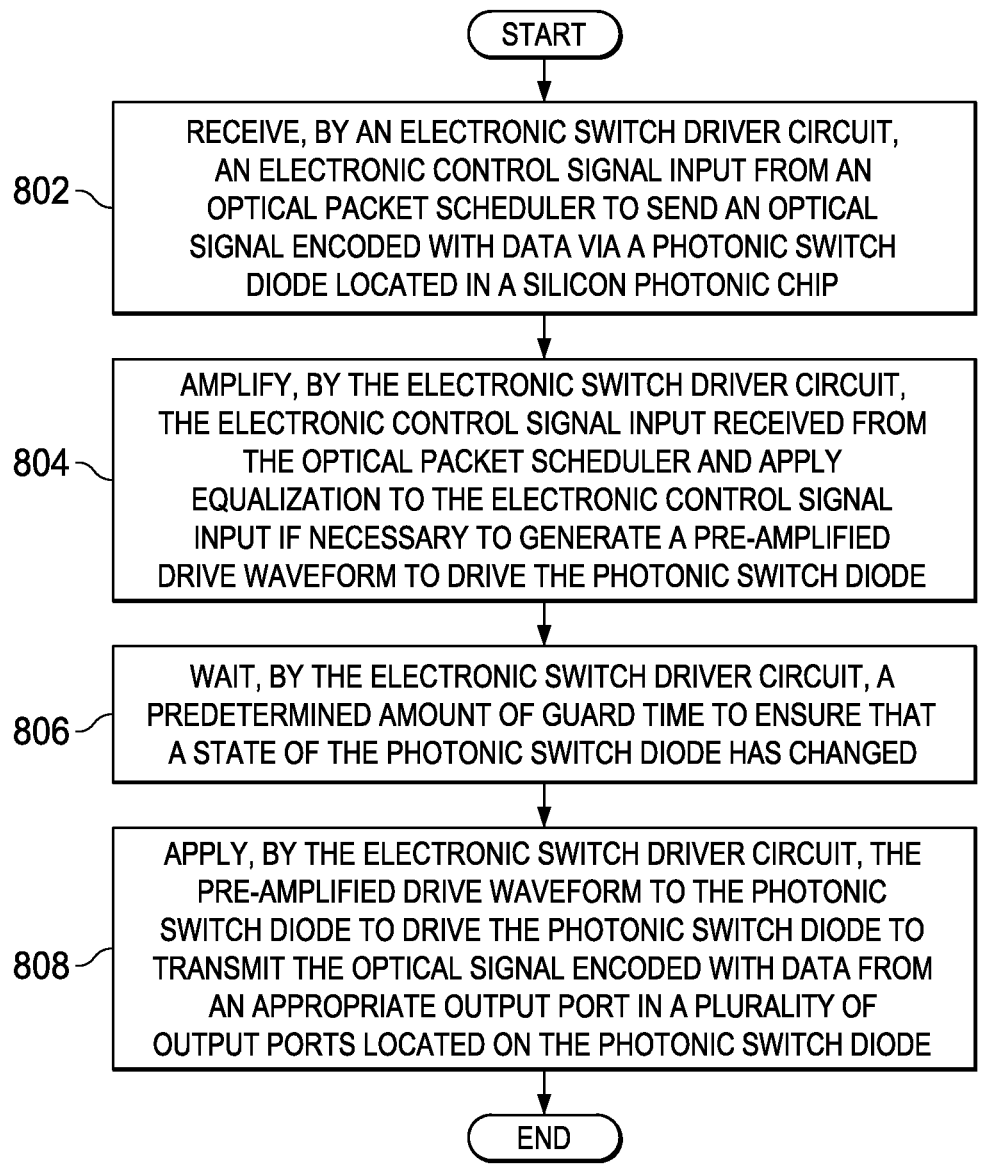
FIG. 8 is a flowchart illustrating a process of an electronic switch driver circuit in accordance with an illustrative embodiment.

With reference now to FIG. 8, a flowchart illustrating a process of an electronic switch driver circuit is shown in accordance with an illustrative embodiment. The process shown in FIG. 8 may be implemented in an electronic switch driver circuit, such as, for example, electronic switch driver circuit 202 in FIG. 2, electronic switch driver circuit 302 in FIG. 3, electronic switch driver circuit 506 or electronic switch driver circuit 510 in FIG. 5, or electronic switch driver circuit 602 and electronic switch driver circuit 604 in FIG. 6.

The process begins when the electronic switch driver circuit receives an electronic control signal input from an optical packet scheduler, such as optical packet scheduler 206 in FIG. 2, to send an optical signal encoded with data via a photonic switch diode located in a silicon photonic chip (step 802). The photonic switch diode may be, for example, photonic switch diode 204 in FIG. 2 or photonic switch diode 304 in FIG. 3. The silicon photonic chip may be, for example, silicon photonic chip 100 in FIG. 1.

After receiving the electronic control signal input from the optical packet scheduler to send an optical signal encoded with data via the photonic switch diode in step 802, the electronic switch driver circuit amplifies the electronic control signal input received from the optical packet scheduler and applies equalization to the electronic control signal input if necessary to generate a pre-emphasized drive waveform to drive the photonic switch diode (step 804). The pre-emphasized drive waveform may be, for example, pre-emphasized drive waveform 402 in FIG. 4, pre-emphasized drive waveform 514 in FIG. 5, or pre-emphasized drive waveform 614 in FIG. 6.

In addition, the electronic switch driver circuit waits a predetermined amount of guard time to ensure that a state of the photonic switch diode has changed (step 806). In other words, optical signals are not passed through the photonic switch diode until state transition has stabilized. An example of a predetermined amount of guard time would be typically one nanosecond to tens of nanoseconds. Subsequent to waiting the predetermined amount of guard time to ensure that the state of the photonic switch diode has changed in step 806, the electronic switch driver circuit applies the pre-emphasized drive waveform to the photonic switch diode to drive the photonic switch diode to transmit the optical signal encoded with data from an appropriate output port in a plurality of output ports located on the photonic switch diode (step 808). The process terminates thereafter.

With reference now to FIG. 9, a diagram of a data processing system is depicted in accordance with an illustrative embodiment. Data processing system 900 is an example of a computer in which computer readable program code or instructions implementing processes of illustrative embodiments may be located. Data processing system 900 may be used to implement the processes shown in the flowchart of FIG. 7. In other words, data processing system 900 may be used to generate a design of a photonic switching system that utilizes an electronic switch driver circuit, which amplifies electronic input signals from an optical packet scheduler and applies equalization when necessary, to increase performance of photonic switch diodes located in an active silicon photonic layer of a silicon photonic chip.

In this illustrative example, data processing system 900 includes communications fabric 902, which provides communications between processor unit 904, memory 906, persistent storage 908, communications unit 910, input/output (I/O) unit 912, and display 914. In this example, communications fabric 902 may take the form of a bus system.

Processor unit 904 serves to execute instructions for software that may be loaded into memory 906. Processor unit 904 may be a number of processors, a multi-processor core, or some other type of processor, depending on the particular implementation.

Memory 906 and persistent storage 908 are examples of storage devices 916. A storage device is any piece of hardware that is capable of storing information, such as, for example, without limitation, data, program code in functional form, and/or other suitable information either on a temporary basis and/or a persistent basis. Storage devices 916 may also be referred to as computer readable storage devices in these illustrative examples. Memory 906 in these examples may be, for example, a random access memory or any other suitable volatile or non-volatile storage device. Persistent storage 908 may take various forms, depending on the particular implementation.

For example, persistent storage 908 may contain one or more components or devices. For example, persistent storage 908 may be a hard drive, a flash memory, a rewritable optical disk, a rewritable magnetic tape, or some combination of the above. The media used by persistent storage 908 also may be removable. For example, a removable hard drive may be used for persistent storage 908.

Communications unit 910, in these illustrative examples, provides for communications with other data processing systems or devices. In these illustrative examples, communications unit 910 is a network interface card.

Input/output unit 912 allows for input and output of data with other devices that may be connected to data processing system 900. For example, input/output unit 912 may provide a connection for user input through a keyboard, a mouse, and/or some other suitable input device. Further, input/output unit 912 may send output to a printer. Display 914 provides a mechanism to display information to a user.

Instructions for the operating system, applications, and/or programs may be located in storage devices 916, which are in communication with processor unit 904 through communications fabric 902. The processes of the different embodiments may be performed by processor unit 904 using computer-implemented instructions, which may be located in a memory, such as memory 906.

These instructions are referred to as program code, computer usable program code, or computer readable program code that may be read and executed by a processor in processor unit 904. The program code in the different embodiments may be embodied on different physical or computer readable storage media, such as memory 906 or persistent storage 908.

Program code 918 is located in a functional form on computer readable media 920 that is selectively removable and may be loaded onto or transferred to data processing system 900 for execution by processor unit 904. Program code 918 and computer readable media 920 form computer program product 922 in these illustrative examples. In one example, computer readable media 920 may be computer readable storage media 924 or computer readable signal media 926. In these illustrative examples, computer readable storage media 924 is a physical or tangible storage device used to store program code 918 rather than a medium that propagates or transmits program code 918.

Alternatively, program code 918 may be transferred to data processing system 900 using computer readable signal media 926. Computer readable signal media 926 may be, for example, a propagated data signal containing program code 918. For example, computer readable signal media 926 may be an electromagnetic signal, an optical signal, and/or any other suitable type of signal. These signals may be transmitted over communications links, such as wireless communications links, optical fiber cable, coaxial cable, a wire, and/or any other suitable type of communications link.

The different components illustrated for data processing system 900 are not meant to provide architectural limitations to the manner in which different embodiments may be implemented. The different advantageous embodiments may be implemented in a data processing system including components in addition to and/or in place of those illustrated for data processing system 900. Other components shown in FIG. 9 can be varied from the illustrative examples shown. The different embodiments may be implemented using any hardware device or system capable of running program code 918.

Thus, illustrative embodiments provide a method for designing a photonic switching system that utilizes an equalized driver to increase performance of a photonic switch diode located on the silicon photonic chip. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiment. The terminology used herein was chosen to best explain the principles of the embodiment, the practical application or technical improvement over technologies found in the marketplace, or to enable others of ordinary skill in the art to understand the embodiments disclosed here.

The flowcharts and block diagrams in the Figures illustrate the architecture, functionality, and operation of possible implementations of various embodiments of the present invention. In this regard, each block in the flowcharts or block diagrams may represent a module, segment, or portion of code which comprises one or more executable instructions for implementing the specified logical function(s). It also should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

The circuit as described above is part of the design for an integrated circuit chip. The chip design is created in a graphical computer programming language and stored in a computer readable storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the computer readable storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:

1. A method for designing a photonics switching system, the method comprising:
  designing, by a data processing system, a photonic switch diode to attain each performance metric in a plurality of performance metrics associated with a photonic switching system based on a weighted value corresponding to each of the plurality of performance metrics;
  selecting, by the data processing system, an electronic switch driver circuit design from a plurality of electronic switch driver circuit designs for the photonic switching system;
  determining, by the data processing system, whether each performance metric in the plurality of performance metrics associated with the photonic switching system meets or exceeds a threshold value corresponding to each of the plurality of performance metrics based on the photonic switch diode designed by the data processing system and the electronic switch driver circuit design selected by the data processing system;

responsive to the data processing system determining that each performance metric in the plurality of performance metrics associated with the photonic switching system meets or exceeds the threshold value corresponding to each of the performance metrics, designing, by the data processing system, the photonic switching system using the photonic switch diode designed by the data processing system and the electronic switch driver circuit design selected by the data processing system that met or exceeded each threshold value corresponding to each of the plurality of performance metrics associated with the photonic switching system based on the weighted value of each performance metric; and responsive to the data processing system determining that each performance metric in the plurality of performance metrics associated with the photonic switching system does not meet or exceed the threshold value corresponding to each of the plurality of performance metrics, re-designing, by the data processing system, the photonic switch diode by increasing the weighted value of each performance metric that did not meet or exceed its respective threshold value and decreasing the weighted value corresponding to a speed of the photonic switching system.

2. The method of claim 1 further comprising:
receiving, by the data processing system, the weighted value for each performance metric in the plurality of performance metrics associated with the photonic switching system.

3. The method of claim 1 further comprising:
storing, by the data processing system, the photonic switching system designed by the data processing system in a storage device.

4. The method of claim 1, wherein the plurality of electronic switch driver circuit designs is a current mode logic design, an inverter logic design, and an inverter logic design coupled with an inductively peaked inverter logic design.

5. The method of claim 1, wherein the electronic switch driver circuit design selected by the data processing system is a complementary metal oxide-semiconductor driver based on current mode logic employing feed-forward equalization to drive the photonic switch diode.

6. The method of claim 1, wherein the electronic switch driver circuit design selected by the data processing system is a complementary metal oxide-semiconductor driver based on inverter logic employing feed-forward equalization to drive the photonic switch diode.

7. The method of claim 1, wherein the electronic switch driver circuit design selected by the data processing system is a complementary metal oxide-semiconductor driver based on inverter logic and inductively peaked inverter logic generating a pre-emphasized drive waveform to drive the photonic switch diode.

8. The method of claim 7, wherein the complementary metal oxide-semiconductor driver based on the inverter logic and the inductively peaked inverter logic uses inductive peaking to enable one of overshoot, undershoot, or both overshoot and undershoot on the pre-emphasized drive waveform exiting the electronic switch driver circuit.

9. The method of claim 1, wherein the photonic switching system includes two electronic switch driver circuits, each of the two electronic switch driver circuits is powered by a separate supply voltage, wherein the photonic switching system uses an edge detector circuit to switch between drive waveform outputs of the two electronic switch driver circuits at different times.

10. The method of claim 1, wherein the plurality of performance metrics associated with the photonic switching system is a speed of the photonic switching system, a size of the photonic switching system, power consumption of the switching system, alignment tolerance of the photonic switching system, and cost of the photonic switching system.

11. The method of claim 1, wherein the weighted value is a value assigned to each of the plurality of performance metrics that indicates a level of importance of each of the plurality of performance metrics in designing the photonic switching system.

12. The method of claim 1, wherein the data processing system determines that each performance metric in the plurality of performance metrics associated with the photonic switching system meets or exceeds the threshold value corresponding to each of the performance metrics by using a simulation program.

13. The method of claim 1, wherein the data processing system determines that each performance metric in the plurality of performance metrics associated with the photonic switching system meets or exceeds the threshold value corresponding to each of the performance metrics by analyzing test data.

14. The method of claim 1, wherein the photonic switch diode is included in an active silicon photonic layer of a silicon photonic chip.

15. The method of claim 14, wherein the electronic switch driver circuit is located on the silicon photonic chip.

16. The method of claim 1, wherein the photonic switch diode includes a plurality of input ports and a plurality of output ports to receive and transmit optical signals encoded with data.

17. The method of claim 1, wherein the photonic switch diode is driven by a pre-emphasized drive waveform that is generated by the electronic switch driver circuit from an electronic control signal input received from an optical packet scheduler.

18. The method of claim 1, wherein the electronic switch driver circuit waits a predetermined amount of guard time to ensure that a state of the photonic switch diode has changed prior to the electronic switch driver circuit applying a drive waveform to the photonic switch diode.

19. The method of claim 18, wherein the state of the photonic switch diode is changed between transmission of each optical packet.

* * * * *